(12) United States Patent
Kim et al.

(10) Patent No.: US 9,070,467 B2
(45) Date of Patent: Jun. 30, 2015

(54) MEMORY SYSTEM INCLUDING NONVOLATILE MEMORY DEVICE AND CONTROL METHOD THEREOF

(71) Applicants: Jinhyun Kim, Yongin-si (KR); Taesik Son, Seongnam-si (KR)

(72) Inventors: Jinhyun Kim, Yongin-si (KR); Taesik Son, Seongnam-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 11 days.

(21) Appl. No.: 13/966,274

(22) Filed: Aug. 13, 2013

(65) Prior Publication Data

US 2014/0071743 A1 Mar. 13, 2014

(30) Foreign Application Priority Data

Sep. 7, 2012 (KR) .................. 10-2012-0099507

(51) Int. Cl.
*G11C 11/16* (2006.01)
*G06F 13/42* (2006.01)

(52) U.S. Cl.
CPC ........ *G11C 11/1675* (2013.01); *G06F 13/4234* (2013.01)

(58) Field of Classification Search
CPC ............................ G11C 11/16; G11C 11/1675
USPC ......................................................... 365/158
See application file for complete search history.

(56) References Cited

U.S. PATENT DOCUMENTS

| 6,704,230 | B1 | 3/2004 | Debrosse et al. | |
| 7,106,621 | B2 | 9/2006 | Frey | |
| 7,453,740 | B2 | 11/2008 | Debrosse et al. | |
| 7,596,045 | B2 | 9/2009 | Debrosse et al. | |
| 8,130,534 | B2 | 3/2012 | Abu-Rahma et al. | |
| 2006/0002180 | A1 | 1/2006 | Frey | |
| 2008/0101131 | A1* | 5/2008 | Lee et al. | 365/189.07 |
| 2008/0175043 | A1 | 7/2008 | Debrosse et al. | |
| 2009/0109735 | A1 | 4/2009 | Debrosse et al. | |
| 2009/0125787 | A1 | 5/2009 | Sakimura et al. | |
| 2009/0129141 | A1* | 5/2009 | Hosotani et al. | 365/148 |
| 2009/0228624 | A1 | 9/2009 | Maldei et al. | |
| 2009/0313521 | A1 | 12/2009 | Hollis | |
| 2010/0034015 | A1 | 2/2010 | Tsuji | |
| 2010/0172173 | A1 | 7/2010 | Abu-Rahma et al. | |
| 2011/0153939 | A1* | 6/2011 | Choi | 711/118 |
| 2011/0261615 | A1 | 10/2011 | Choi et al. | |
| 2012/0195112 | A1* | 8/2012 | Alam et al. | 365/158 |

FOREIGN PATENT DOCUMENTS

| JP | 2006527447 A | 11/2006 |
| KR | 20130005499 A | 1/2013 |

\* cited by examiner

*Primary Examiner* — Hoai V Ho
*Assistant Examiner* — Tri Hoang
(74) *Attorney, Agent, or Firm* — Renaissance IP Law Group LLP

(57) ABSTRACT

A memory system is provided including a host configured to generate data bit inversion (DBI) information of data according to a major bit of the data, and a nonvolatile memory device configured to invert one or more bits of the data according to the DBI information, and to program the DBI information and the data. A control method of a memory system comprises generating DBI information according to the number of "1" bits of data relative to the number of "0" bits of the data, transferring the data and the DBI information, and inverting bits of the data according to the DBI information, the inverted bits of the data being programmed at the nonvolatile memory device.

20 Claims, 15 Drawing Sheets

<READ '0' or '1'>

Fig. 11

| | Host | Channel | Control Logic | Cell |
|---|---|---|---|---|
| DQ0 | 1 | 1 | 1 | 0 |
| DQ1 | 1 | 1 | 1 | 0 |
| DQ2 | 0 | 0 | 0 | 1 |
| DQ3 | 1 | 1 | 1 | 0 |
| DQ4 | 0 | 0 | 0 | 1 |
| DQ5 | 1 | 1 | 1 | 0 |
| ⋮ | ⋮ | ⋮ | ⋮ | ⋮ |
| DQ14 | 1 | 1 | 1 | 0 |
| DQ15 | 0 | 0 | 0 | 1 |
| DBI | 0 | 0 | 0 | 0 |

MEMORY SYSTEM INCLUDING NONVOLATILE MEMORY DEVICE AND CONTROL METHOD THEREOF

CROSS-REFERENCE TO RELATED APPLICATIONS

A claim for priority under 35 U.S.C. §119 is made to Korean Patent Application No. 10-2012-0099507 filed Sep. 7, 2012, in the Korean Intellectual Property Office, the entire contents of which are hereby incorporated by reference.

BACKGROUND

The inventive concepts described herein relate to a semiconductor memory device, and more particularly, relate to a memory system including a magnetic random access memory device and a control method thereof.

A semiconductor memory device may be volatile or nonvolatile. A volatile memory device may have rapid read and write speeds, while contents stored in the volatile memory device may be lost at power-off. On the other hand, a nonvolatile memory device may retain contents stored therein even at power-off. Thus, the nonvolatile memory device may be used to store contents which must be retained regardless of whether a power is supplied or not.

In recent years, the demand for high-integration and large-volume nonvolatile memory devices has increased and is likely to increase further. For example, such a representative memory device may be a flash memory device, which is mainly used within a handheld electronic device. There is ongoing research in connection with nonvolatile elements that have a high integration, a large volume, and a random access function.

A magnetic random access memory (MRAM) using a magnetic element is one example of such nonvolatile elements. The MRAM possesses advantageous characteristics such as rapid operating speed and high integration. For this reason, active research on the commercialization of the MRAM continues.

SUMMARY

One aspect of embodiments of the inventive concept is directed to provide a memory system comprising a host configured to generate data bit inversion (DBI) information of data according to a major bit of the data, and to provide the data and the DBI information. The system may also include a nonvolatile memory device configured to invert one or more bits of the data according to the DBI information, and to program the DBI information and the data. The nonvolatile memory device may invert the one or more bits of the data according to the DBI information before programming of the data.

In example embodiments, the nonvolatile memory device is a magnetic random access memory.

In example embodiments, the nonvolatile memory device comprises a memory cell array including a plurality of memory cells connected with a plurality of bit lines and a plurality of word lines; a word line decoder configured to apply word line voltages to the word lines; a bit line selector configured to select at least one of the bit lines; and control logic configured to control the word line decoder and the bit line selector such that bits of the data inverted according to the DBI information are programmed at the plurality of memory cells.

In example embodiments, the plurality of memory cells includes a plurality of data cells and a DBI cell associated with the plurality of data cells. In example embodiments, the control logic may control the word line decoder and the bit line selector such that the inverted bits of the data are programmed at the plurality of data cells and the DBI information is programmed at the DBI cell.

In example embodiments, the nonvolatile memory device is configured to read bits programmed at the plurality of data cells in response to a read request from the host, and invert the read bits according to the DBI information programmed at the DBI cell.

In example embodiments, the host counts the number of "0" bits relative to the number of "1" bits of the data, sets the DBI information to a first value when a count result indicates that a "1" bit is a major bit, and sets the DBI information to a second value when a count result indicates that a "0" bit is a major bit.

In example embodiments, a first write voltage for programming a "0" bit at the plurality of data cells and a second write voltage for programming a "1" bit at the plurality of data cells have different polarities. In example embodiments, a read voltage for reading bits programmed at the plurality of data cells is a voltage having the same polarity as one of the first and second write voltages.

In example embodiments, the host is configured to transfer data to the nonvolatile memory device from the host via a data channel, and to transfer the DBI information to the nonvolatile memory device from the host via a DBI interface separated from the data channel.

In example embodiments, the host is configured to invert one or more bits of the data sent via the data channel according to the DBI information.

Another aspect of embodiments of the inventive concept is directed to provide a control method of a memory system which includes a nonvolatile memory device, comprising, for example: generating data bit inversion (DBI) information according to the number of "1" bits of data relative to the number of "0" bits of the data, transferring the data and the DBI information, and inverting bits of the data according to the DBI information, the inverted bits of the data being programmed at the nonvolatile memory device.

In example embodiments, the nonvolatile memory device includes a plurality of data cells and a DBI cell corresponding to the plurality of data cells. The control method may further include programming the inverted bits of the data at the plurality of data cells, and programming the DBI information at the DBI cell.

In example embodiments, the control method further comprises reading bits programmed at the plurality of data cells in response to a request from the host, and inverting the read bits according to the DBI information.

In example embodiments, the nonvolatile memory device is a magnetic random access memory.

In example embodiments, a first write voltage for programming a "0" bit at the nonvolatile memory device and a second write voltage for programming a "1" bit at the nonvolatile memory device have different polarities.

In example embodiments, a read voltage for reading bits programmed at the nonvolatile memory device is a voltage having the same polarity as one of the first and second write voltages.

In example embodiment, a method for programming data on a non-volatile memory device is provided, the method comprising receiving, at the non-volatile memory device, a plurality of data bits from a host, receiving, at the non-volatile memory device, data bit inversion (DBI) information from the host, wherein the DBI information is set to a first value when a "1" bit is a major bit among the plurality of data bits, and set to a second value when a "0" bit is a major bit among the plurality of data bits, inverting, by the non-volatile memory device, the plurality of data bits in response to the DBI information having the first value, and not inverting, by the non-volatile memory device, the plurality of data bits in response to the DBI information having the second value.

In example embodiments, the method may further include programming the inverted plurality of data bits in the non-volatile memory device in response to the DBI information having the first value, and programming the non-inverted plurality of data bits in the non-volatile memory device in response to the DBI information having the second value.

In example embodiments, the method may further include reading the programmed plurality of data bits, after reading the programmed plurality of data bits, inverting the plurality of read data bits in response to the DBI information having the first value, and after reading the programmed plurality of data bits, not inverting the plurality of read data bits in response to the DBI information having the second value.

In example embodiments, the method may further include prior to receiving the plurality of data bits and the DBI information at the non-volatile memory device: inverting, by a host, the plurality of data bits in response to the DBI information having the first value, not inverting, by the host, the plurality of data bits in response to the DBI information having the second value, inverting, by a channel, the plurality of data bits in response to the DBI information having the first value, and not inverting, by the channel, the plurality of data bits in response to the DBI information having the second value.

BRIEF DESCRIPTION OF THE FIGURES

The above and other objects and features will become apparent from the following description with reference to the following figures, wherein like reference numerals refer to like parts throughout the various figures unless otherwise specified, and wherein

FIGS. 10 and 11 are diagrams schematically illustrating a control method of a memory system according to another embodiment of the inventive concept.

DETAILED DESCRIPTION

Figure 1:
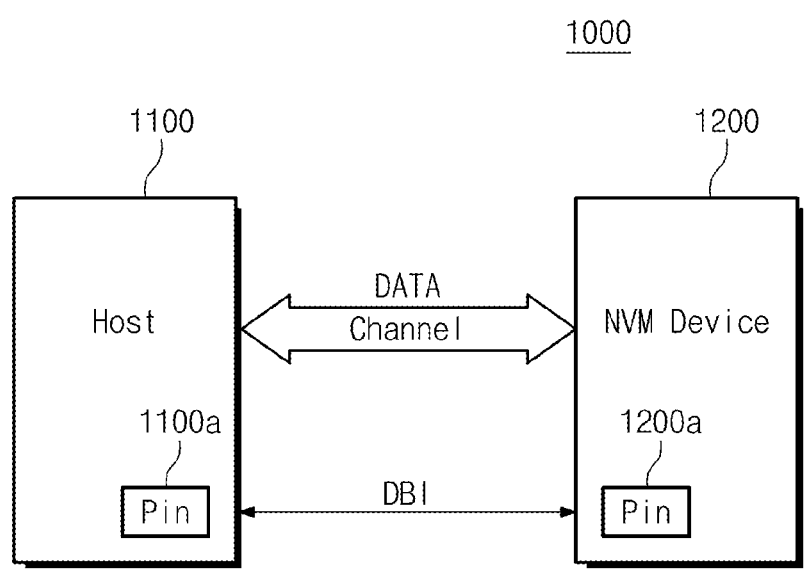
FIG. 1 is a block diagram schematically illustrating a memory system according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath," "below," "lower," "under," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a," "an," and "the" are intended to include the plural forms as well, unless the context clearly indicates otherwise.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on," "connected to," "coupled to," or "adjacent to" another element or layer, it can be directly on, connected, coupled, or adjacent to the other element or layer, or intervening elements or layers may be present. In contrast, when an element is referred to as being "directly on," "directly connected to," "directly coupled to," or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

In this specification, a major bit of data may mean a bit which takes the most number of bits included in the data. For example, in case of data of "01100000001", the number of "0" bits in the data may be eight and the number of "1" bits may be three. In this case, a major bit of the data may be a "0" bit.

Below, the inventive concept will be more fully described with reference to accompanying drawings.

FIG. 1 is a block diagram schematically illustrating a memory system according to an embodiment of the inventive concept. Referring to FIG. 1, a memory system 1000 may include a host 1100 and a nonvolatile memory device 1200.

The host 1100 may provide the nonvolatile memory device 1200 with data. The data may be transferred via a data channel connecting the host 1100 and the nonvolatile memory device 1200. In example embodiments, the data channel may include an electrical connection means via a plurality of pins.

The host 1100 may count the number of "0" bits or "1" bits of the data. The host 1100 may decide or generate data bit inversion (DBI) information corresponding to the data according to a count result. For example, if the count result indicates that a "0" bit is a major bit (i.e., the number of "0" bits in the data forms a majority relative to the "1" bits in the data), the host 1100 may set the DBI information to "1". On the other hand, if the count result indicates that a "1" bit is a major bit (i.e., the number of "1" bits in the data forms a majority relative to the "0" bits in the data), the host 1100 may set the DBI information to "0". Alternatively, the host 1100 may set the DBI information to "0" when a "0" bit is a major bit and to "1" when a "1" bit is a major bit. As further described below, when the nonvolatile memory device 1200 programs transfer data, the DBI information may be used as reference information for inverting bits of the transferred data.

The DBI information generated by the host 1100 may be transferred via a separate DBI interface, which is separated from the data channel. For example, the DBI information may be transferred via separate DBI pins 1100a and 1200a, which are provided at the host 1100 and the nonvolatile memory device 1200, respectively.

The nonvolatile memory device 1200 may receive data and DBI information provided from the host 1100. The data and DBI information may be programmed at memory cells of the nonvolatile memory device 1200. The nonvolatile memory device 1200 may invert bits of the data according to the DBI information, and the inverted data bits may be programmed at memory cells of the nonvolatile memory device 1200. For example, in the case that the DBI information has a value of "0", the nonvolatile memory device 1200 may invert bits of the input data. That is, when a data bit is "0", the nonvolatile memory device 1200 may program a data bit of "1". When a data bit is "1", the nonvolatile memory device 1200 may program a data bit of "0". In the case that the DBI information has a value of "1", the nonvolatile memory device 1200 may program bits of the input data without modification (i.e., without inversion).

In example embodiments, the nonvolatile memory device 1200 may be a magnetic random access memory (MRAM). As will be described later, in case of the MRAM, a write voltage applied to a memory cell to program a specific bit (e.g., a "0" bit) and a read voltage applied to a memory cell to read data programmed at the memory cell may be voltages having the same polarity (e.g., sign or direction). The read voltage may have the same polarity (e.g., sign or direction) as the write voltage and be lower than the write voltage.

More specifically, in the case that a forward-direction voltage applied to a memory cell is higher than a threshold value, an applied voltage may act as a write voltage of a "0" bit. On the other hand, in the case that a forward-direction voltage applied to a memory cell is lower than the threshold value, an applied voltage may act as a read voltage.

If a read voltage exceeding a threshold value is excessively applied, it may erroneously act as a write voltage of a "0" bit. In this case, a memory cell may be programmed with a "0" bit by the read voltage. Such a rate in which data stored at a memory cell is changed by a read voltage that is excessively applied may be referred to as a read error rate (RER).

The RER may vary according to a major bit of data stored at memory cells. For example, if a major bit stored at the memory cell is a "0" bit, the RER may be relatively less or may otherwise decrease. The reason is that the "0" bit having been previously stored as such, even though a read voltage is excessively applied, remains as a "0" bit. On the other hand, if a major bit stored at the memory cell is a "1" bit, the RER may be relatively greater or may otherwise increase. The reason is that the "1" bit having been previously stored as such may be inadvertently flipped to a "0" bit due to the excessively applied read voltage. A number of memory cells may be abnormally written to store a "0" bit due to the read voltage increases.

With the inventive concept, if a major bit is a "1" bit, inverting and programming data bits may be performed according to DBI information, which itself may be decided according to a major bit of data. In this case, since memory cells are practically programmed with a "0" bit being a major bit, a read error (e.g., a read error rate) due to a read voltage may decrease. Also, the reliability of the memory system may be improved.

Figure 2:
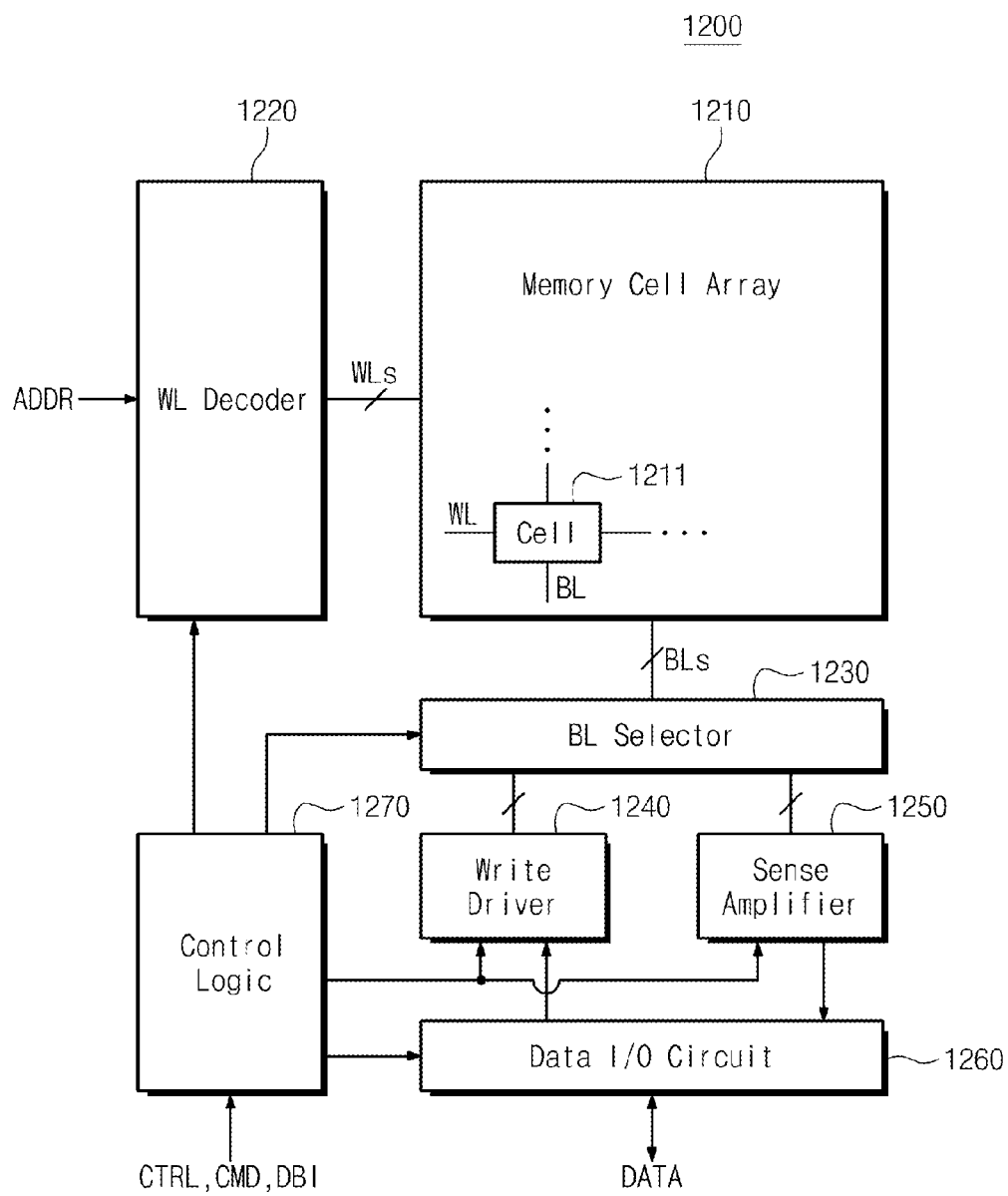
FIG. 2 is a block diagram schematically illustrating a non-volatile memory device in FIG. 1.

FIG. 2 is a block diagram schematically illustrating a nonvolatile memory device in FIG. 1. Referring to FIG. 2, a nonvolatile memory device 1200 may include a memory cell array 1210, a word line decoder 1220, a bit line selector 1230, a write driver 1240, a sense amplifier 1250, a data input/output circuit 1260, and control logic 1270.

The memory cell array 1210 may be connected with the word line decoder 1220 via word lines and with the bit line selector 1230 via bit lines. The memory cell array 1210 may include a plurality of memory cells. In example embodiments, memory cells arranged in a row direction may be connected with the word lines. Memory cells arranged in a column direction may be connected with the bit lines. Each of memory cells 1211 in the memory cell array 1210 may correspond to a word line WL and a bit line BL. The memory cell 1211 may store one or more bits according to voltages or currents applied to the word line WL and the bit line BL.

In example embodiments, the memory cells of the memory cell array 1210 may be MRAM cells.

The word line decoder 1220 may be connected with the memory cell array 1210 via the word lines. The word line decoder 1220 may be configured to operate responsive to a control of the control logic 1270. The word line decoder 1220 may be configured to decode a row address of an address ADDR received from an external device. The word line decoder 1220 may select a word line according to the decoded row address.

The bit line selector 1230 may be connected with the memory cell array 1210. The bit line selector 1230 may select the bit lines in response to a control of the control logic 1270. At a program operation, the bit line selector 1230 may connect selected bit lines with the write driver 1240. At a read operation, the bit line selector 1230 may connected selected bit lines with the sense amplifier 1250.

The write driver 1240 may operate responsive to a control of the control logic 1270. The write driver 1240 may be configured to program memory cells connected with bit lines selected by the bit line selector 1230 and word lines selected by the word line decoder 1220. The write driver 1240 may generate a set current or a reset current to be provided to selected bit lines, based on data received from the data input/output circuit 1260.

The sense amplifier 1250 may operate responsive to a control of the control logic 1270. The sense amplifier 1250 may be configured to read data from memory cells connected with bit lines selected by the bit line selector 1230 and word lines selected by the word line decoder 1220. The sense amplifier 1250 may read data from memory cells by sensing currents flowing via selected bit lines or voltages applied to the selected bit lines. The sense amplifier 1250 may output the read data to the data input/output circuit 1260.

The data input/output circuit 1260 may operate responsive to a control of the control logic 1270. The data input/output circuit 1260 may transfer data received from an external device into the write driver 1250. The data input/output circuit 1260 may output data provided from the sense amplifier 1250 to the external device.

The control logic 1270 may control an overall operation of the nonvolatile memory device 1200. The control logic 1270 may operate responsive to a command CMD and a control signal CTRL received from the external device.

The control logic 1270 may control the nonvolatile memory device 1200 based on DBI information received from the external device. The control logic 1270 may control the word line decoder 1220 and the bit line selector 1230 such that bits of the input data are inverted according to the DBI information and the inverted bits of the input data are programmed at the memory cell array 1210. For example, if the DBI information has a value of "0", the control logic 1270 may control the nonvolatile memory device 1200 such that an inverted version of input data is programmed. On the other hand, if the DBI information has a value of "1", the control logic 1270 may control the nonvolatile memory device 1200 such that input data is programmed without modification (i.e., without inversion).

Accordingly, a "0" bit may be programmed at the memory cell array 1210 as a major bit. Thus, a read error (e.g., a read error rate) due to a read voltage may decrease, and the reliability of a memory system may be improved.

Figure 3:
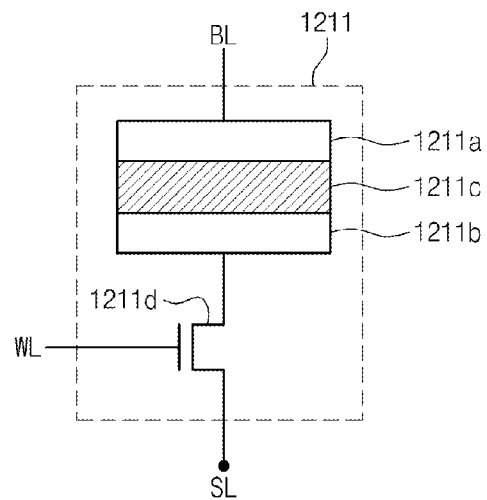
FIG. 3 is a diagram schematically illustrating a structure of a memory cell according to an embodiment of the inventive concept.

FIG. 3 is a diagram schematically illustrating a structure of a memory cell according to an embodiment of the inventive concept. It is assumed in this example that a memory cell is an MRAM cell. MRAM may be a memory which stores a magnetic polarization state at a magnetic thin film, and may perform a write operation by switching a magnetic polarization state by a magnetic field generated according to a bit line current or a word line current.

Referring to FIG. 3, a memory cell 1211 may include a selection transistor 1211*d* and a magnetic tunnel junction (MTJ) formed of a pinned magnetic layer 1211*a*, a free magnetic layer 1211*b*, and a tunnel junction layer 1211*c*.

A thickness of the pinned magnetic layer 1211*a* may be thicker than that of the free magnetic layer 1211*b*. A magnetic polarization state of the pinned magnetic layer 1211*a* may be switched when a strong magnetic field is applied. However, a magnetic polarization state of the pinned magnetic layer 1211*a* can be switched even though a weak magnetic field is applied.

The tunnel junction layer 1211*c* may be interposed between the pinned magnetic layer 1211*a* and the free magnetic layer 1211*b*. That is, the pinned magnetic layer 1211*a* and the free magnetic layer 1211*b* may be separated by the tunnel junction layer 1211*c*.

The pinned magnetic layer 1211*a* and the free magnetic layer 1211*b* may have a material such as NiFeCo or CoFe. The tunnel junction layer 1211*c* may have a material such as MgO or AlO3.

The MRAM cell 1211 having the pinned magnetic layer 1211*a*, the tunnel junction layer 1211*c*, and the free magnetic layer 1211*b* sequentially stacked may have different electric resistance values according to magnetization directions of the pinned magnetic layer 1211*a* and the free magnetic layer 1211*b*. For example, if the magnetization directions of the pinned magnetic layer 1211*a* and the free magnetic layer 1211*b* are equal to each other (i.e., at a parallel state), the MRAM cell 1211 may have a relatively low resistance value. On the other hand, if the magnetization directions of the pinned magnetic layer 1211*a* and the free magnetic layer 1211*b* are opposite to each other (i.e., at an anti-parallel state), the MRAM cell 1211 may have a relatively high resistance value.

The selection transistor 1211*d* may be turned on or off by a voltage of a word line WL. At a program operation (e.g., a read operation), the MRAM cell 1211 may be selected or unselected by turning on or off the selection transistor 1211*d*.

Figure 4:
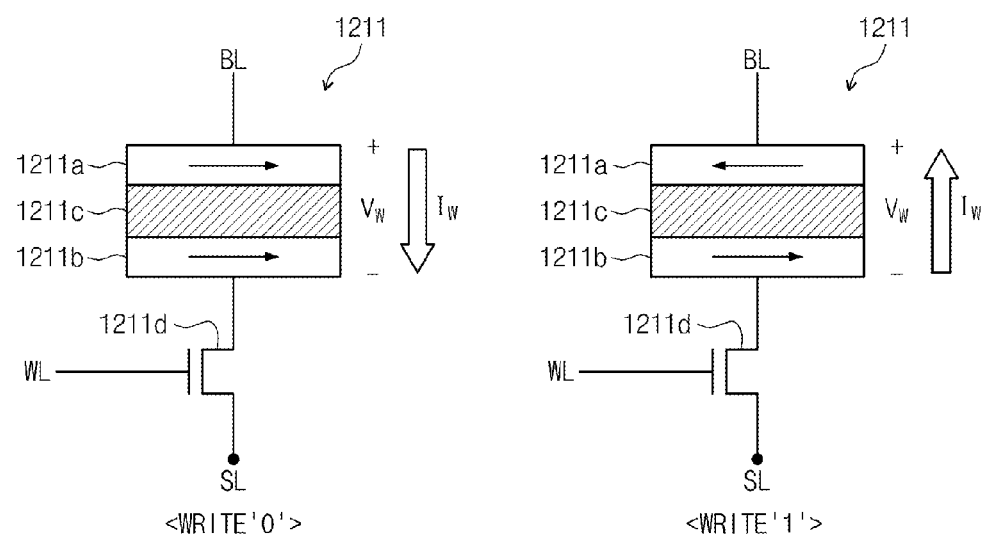
FIG. 4 is a diagram illustrating a method of programming data at a memory cell in FIG. 3.

FIG. 4 is a diagram illustrating a method of programming data at a memory cell in FIG. 3. In FIG. 4, there is illustrated an example in which a "0" or "1" bit is programmed at a memory cell 1211.

At a program operation, a nonvolatile memory device 1200 (e.g., of FIG. 2) may program the memory cell 1211 with a "0" or "1" bit by magnetizing the memory cell 1211 into a parallel state or an anti-parallel state.

For example, in a "0" write operation, the nonvolatile memory device 1200 may apply a write voltage having a forward polarity (e.g., a positive sign or direction) to the memory cell 1211 such that a magnetization direction of a free magnetic layer 1211*b* is set the same as that of the pinned magnetic layer 1211*a* (e.g., a parallel state). The parallel state may mean that a "0" bit is programmed at the memory cell 1211, and the memory cell 1211 may have a relative low resistance value in the parallel state.

In a "1" write operation, the nonvolatile memory device 1200 may apply a write voltage having a reverse polarity (e.g., a negative sign or direction) to the memory cell 1211 such that a magnetization direction of a free magnetic layer 1211*b* is opposite to that of the pinned magnetic layer 1211*a* (e.g., an anti-parallel state). The anti-parallel state may mean that a "1" bit is programmed at the memory cell 1211, and the memory cell 1211 may have a relative high resistance value in the anti-parallel state.

Figure 5:
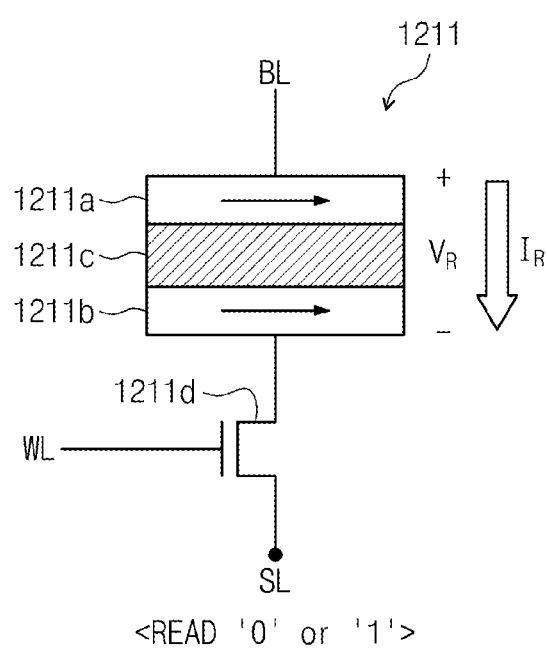
FIG. 5 is a diagram schematically illustrating a method of reading data from a memory cell in FIG. 3.

FIG. 5 is a diagram schematically illustrating a method of reading data from a memory cell in FIG. 3. In FIG. 5, there is illustrated an example in which there is read a "0" or "1" bit programmed at a memory cell 1211.

At a read operation, a nonvolatile memory device 1200 may apply a read voltage $V_R$ to a memory cell 1211. A resistance value of the memory cell 1211 may be read from a magnitude of a read current $I_R$ flowing via the memory cell 1211. If a resistance value of the memory cell 1211 is relatively low, the nonvolatile memory device 1200 may decide the memory cell 1211 is a memory cell in which a "0" bit is programmed. If a resistance value of the memory cell 1211 is relatively high, the nonvolatile memory device 1200 may decide the memory cell 1211 is a memory cell in which a "1" bit is programmed.

As described with reference to FIGS. 4 and 5, the read voltage $V_R$ may be a voltage having the same polarity (i.e., the same sign or direction) as a write voltage Vw for programming a "0" bit. If the read voltage $V_R$ is excessively increased due to an error, the read voltage $V_R$ may act as the write voltage Vw on a "0" bit. This may be a problem in a memory cell in which a "1" bit is programmed. For example, in the case that an excessive read voltage $V_R$ is applied to a memory cell in which a "1" bit is programmed, the read voltage $V_R$ may act like a write voltage on a "0" bit. In this case, at a read operation, a magnetization direction of a free magnetic layer 1211*b* of the memory cell 1211 may be changed by the read voltage $V_R$, so that a "0" bit is newly programmed at the memory cell 1211. That is, data stored at a memory cell may be changed by a read operation. Such a rate that data stored at a memory cell is changed by a read operation may be referred to as a read error rate (RER).

Meanwhile, in a memory cell (e.g., a memory cell in which a "0" bit is programmed) programmed by a write voltage having the same polarity as the read voltage $V_R$, a magnetization direction of the free magnetic layer 1211*b* may not be switched although an excessive read current is applied. Thus, although the number of memory cells, programmed with a "0" bit, from among all memory cells increases, the RER may decrease.

In some embodiments of the inventive concept, bits of input data may be inverted and programmed according to a major bit of the input data to reduce the RER of a memory system 1000. In the case that a major bit of data to be programmed is a "1" bit, bits of the data to be programmed may be inverted, and the inverted bits of the input data may be programmed at memory cells. In other words, a "1" bit may be programmed at a memory cell instead of a "0" bit included in data to be programmed. On the other hand, a "0" bit may be programmed at a memory cell instead of a "1" bit included in data to be programmed. In the case that a major bit of data to be programmed is a "0" bit, bits of the data to be programmed may be programmed at memory cells without inversion.

Accordingly, the number of memory cells, in which a "0" bit is programmed, from among all memory cells may increase. Thus, the RER of the nonvolatile memory device 1200 may be reduced.

Figure 6:
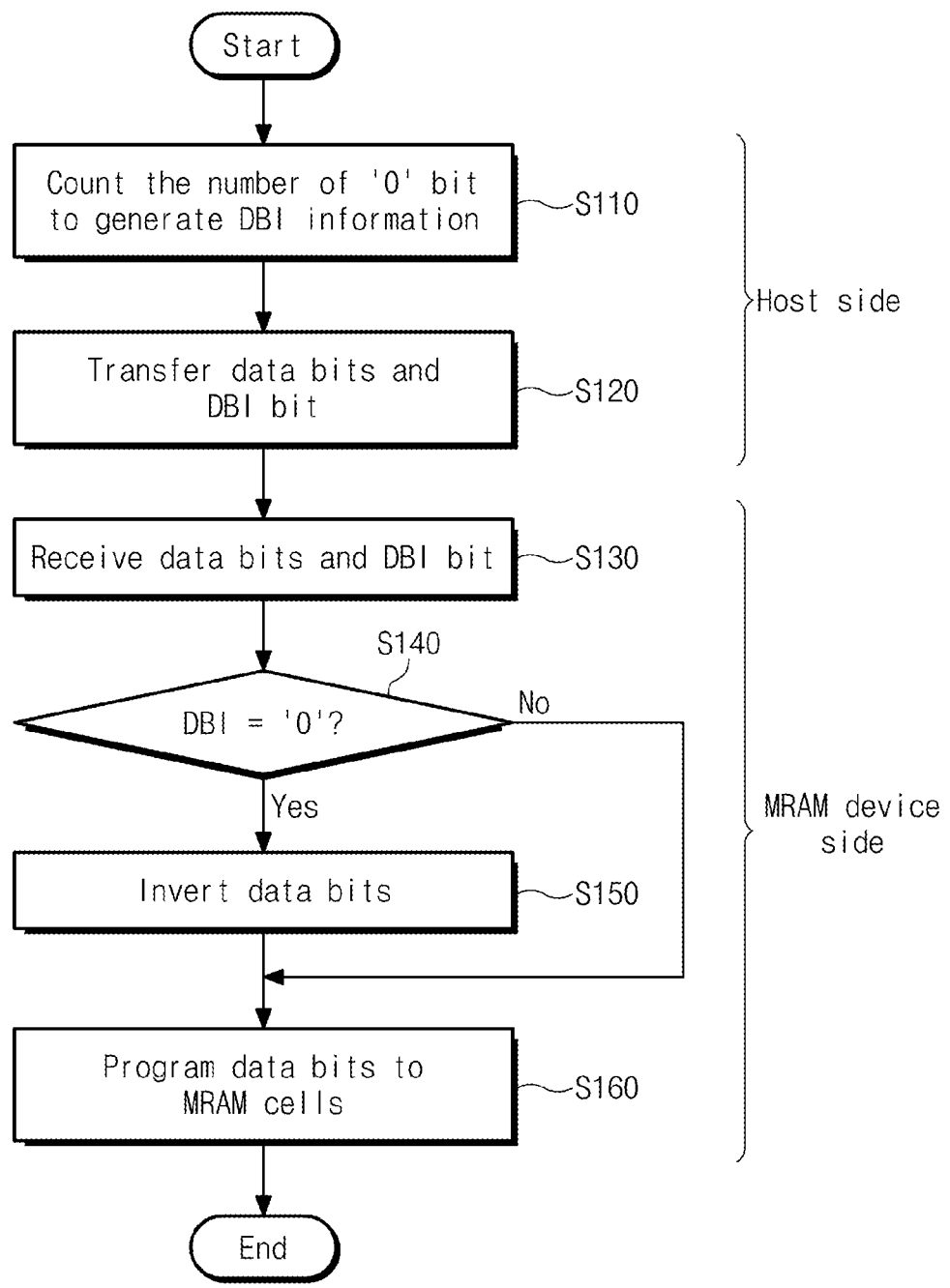
FIG. 6 is a flow chart illustrating a program method of a memory system according to an embodiment of the inventive concept.

FIG. 6 is a flow chart illustrating a program method of a memory system according to an embodiment of the inventive concept. Referring to FIG. 6, a program method of a memory system 1000 (e.g., of FIG. 1) may include operations S110 to S160. Operations S110 and S120 may be performed at a host 1100 (e.g., of FIG. 1) of the memory system 1000, and operations S130 to S160 may be performed at a nonvolatile memory device 1200 (e.g., of FIG. 1) of the memory system 1000.

In example embodiments, the nonvolatile memory device 1200 may include a memory cell array formed of a plurality of MRAM cells.

In operation S110, the host 1100 may count the number of "0" bits or "1" bits of data to be programmed at the nonvolatile memory device 1200. The host 1100 may decide a major bit of the data to be programmed according to a count result. The major bit may indicate a bit that represents the most number of bits having the same value included in the data.

The host 1100 may generate DBI information corresponding to the data to be programmed according to the major bit. In example embodiments, the DBI information may be set to "1" when the major bit is a "0" bit and to "0" when the major bit is a "1" bit.

In operation S120, the host 1100 may transfer the data to be programmed and the DBI information to the nonvolatile memory device 1200. In example embodiments, the host 1100 may transfer the data to be programmed to the nonvolatile memory device 1200 via a data channel. The data channel may be formed of a data communication interface using a plurality of data transfer pins.

In example embodiments, the DBI information may be transferred to the nonvolatile memory device 1200 via a DBI interface separated from the data channel. The DBI interface may be implemented by controlling a data transfer between DBI pins 1100*a* and 1200*a* provided at the host 1100 and the nonvolatile memory device 1200.

In operation S130, the nonvolatile memory device 1200 may receive the data and the DBI information provided from the host 1100. In example embodiments, the nonvolatile memory device 1200 may receive DBI information whenever data having a predetermined size is received. For example, the nonvolatile memory device 1200 may receive 1-bit DBI information whenever 128-bit data is received. At this time, the DBI information can be received as a DBI bit inserted every predetermined size of data, similar in a sense to a parity bit of corresponding data, although a parity bit is implemented differently and for a different purpose.

In operations S140 and S150, the nonvolatile memory device 1200 may invert bits of the input data based on the DBI information.

In operation S140, the nonvolatile memory device 1200 may read the DBI information and determine the value of the DBI information. If the DBI information has a value of "1", a major bit of the input data may be a "0" bit. On the other hand, if the DBI information has a value of "0", a major bit of the input data may be a "1" bit.

If the DBI information has a value of "0", the flow proceeds to operation S150. If the DBI information has a value of "1", the flow proceeds to operation S160.

In operation S150, the nonvolatile memory device 1200 may invert bits of the input data. As described above, if the number of memory cells programmed with a "0" bit, from among all memory cells increases, the RER may decrease.

Since the read DBI information has a value of "0", a major bit of the input data may be "1". Thus, each bit of the input data may be inverted to increase the number of memory cells in which a "0" bit is programmed. Afterwards, a major bit of the inverted bits of the input data may become a "0" bit.

In operation S160, the nonvolatile memory device 1200 may program memory cells with the input data. In example embodiments, memory cells in which data is to be programmed may be MRAM cells. Bits of data to be programmed at memory cells may be inverted bits. For example, in the case that read DBI information is determined to be "0" at operation S140, bits of the input data may be inverted at operation S150. In this case, the inverted bits of the input data may be programmed at memory cells. In the case that read DBI information is determined to be "1" at operation S140, the operation S150 may not be performed. In this case, bits of the input data may be programmed at memory cells without modification (e.g., without inversion).

In example embodiments, the DBI information may be programmed at memory cells together with the input data. The input data may be programmed at data cells, and the DBI information may be programmed at DBI cells separated from the data cells.

With the above description, if a major bit of data to be programmed is a "1" bit, bits of the data to be programmed may be inverted, and the inverted bits may be programmed at memory cells. On the other hand, if a major bit of data to be programmed is a "0" bit, bits of the data may be programmed at memory cells without modification (e.g., without inversion). As a result, the number of memory cells in which a "0" bit is programmed may be always more than the number of memory cells in which a "1" bit is programmed. Thus, the number of memory cells in which a "0" bit is programmed may increase, so that the RER of the nonvolatile memory device 1200 decreases.

Figure 7:
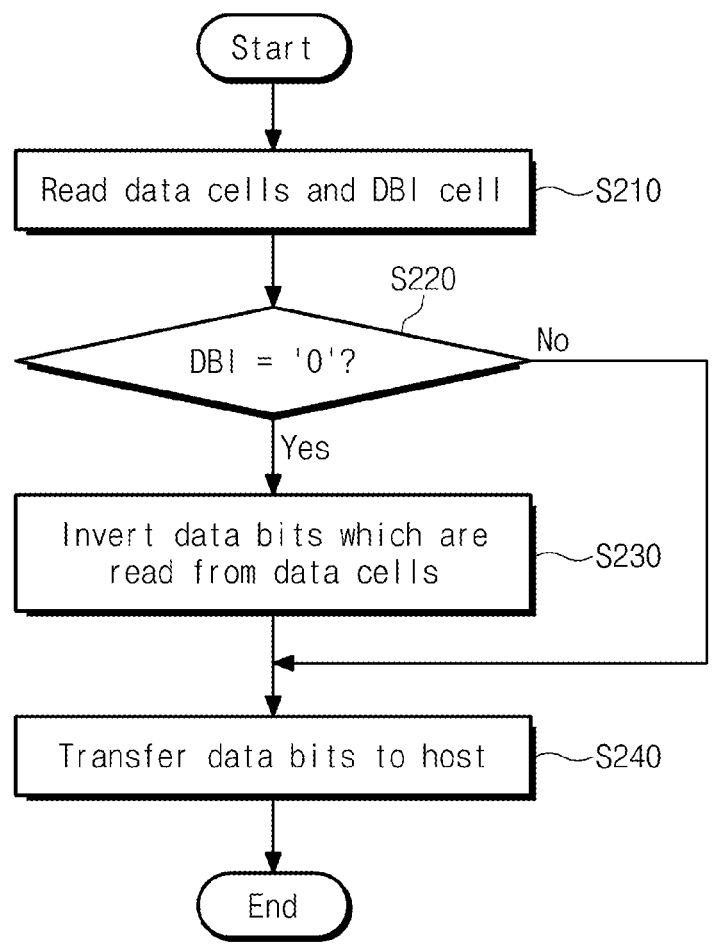
FIG. 7 is a flow chart illustrating a read method of a memory system according to an embodiment of the inventive concept.

FIG. 7 is a flow chart illustrating a read method of a memory system according to an embodiment of the inventive concept. Referring to FIG. 7, a read method of a memory system 1000 (e.g., of FIG. 1) may include operations S210 to S240.

In operation S210, a nonvolatile memory device 1200 (e.g., of FIG. 1) may read data and DBI information stored at memory cells in response to a read request of a host 1100 (e.g., of FIG. 1). In example embodiments, data may be read from data cells, and DBI information corresponding to the read data may be read from a DBI cell.

In operations S220 and S230, the nonvolatile memory device 1200 may invert bits of the read data according to the read DBI information.

In operation S220, the nonvolatile memory device 1200 may read the DBI information and determine the value of the DBI information. If the DBI information has a value of "0", this may mean that bits of the read data are inverted at a program operation. If the DBI information has a value of "1", this may mean that bits of the read data are programmed without inversion at a program operation.

If the DBI information has a value of "0", the flow proceeds to operation S230. If the DBI information has a value of "1", the flow proceeds to operation S240.

In operation S230, the nonvolatile memory device 1200 may invert bits of the read data. As described above, when the DBI information has a value of "0", bits of the read data may be inverted at a program operation. Thus, the nonvolatile memory device 1200 may invert bits of the read data to restore bits of the read data to an original state.

In operation S240, the nonvolatile memory device 1200 may send the read data to the host 1100. At this time, the transferred data bits may be an inverted version of bits programmed at memory cells. For example, if the DBI information is determined to have a value of "0" at operation S220, bits of the read data may be inverted at operation S230. The nonvolatile memory device 1200 may transfer the inverted bits to the host 1100. On the other hand, if the DBI information is determined to have a value of "1" at operation S220, the operation S230 may not be performed. In this case, the flow proceeds to S240, and bits of the read data may be transferred to the host 1100 without inversion.

Accordingly, during a read operation, the nonvolatile memory device 1200 may again invert bits inverted during a program operation. Thus, original data may be provided to the host 1100 regardless of whether bits of data were inverted during the program operation.

Figure 8:
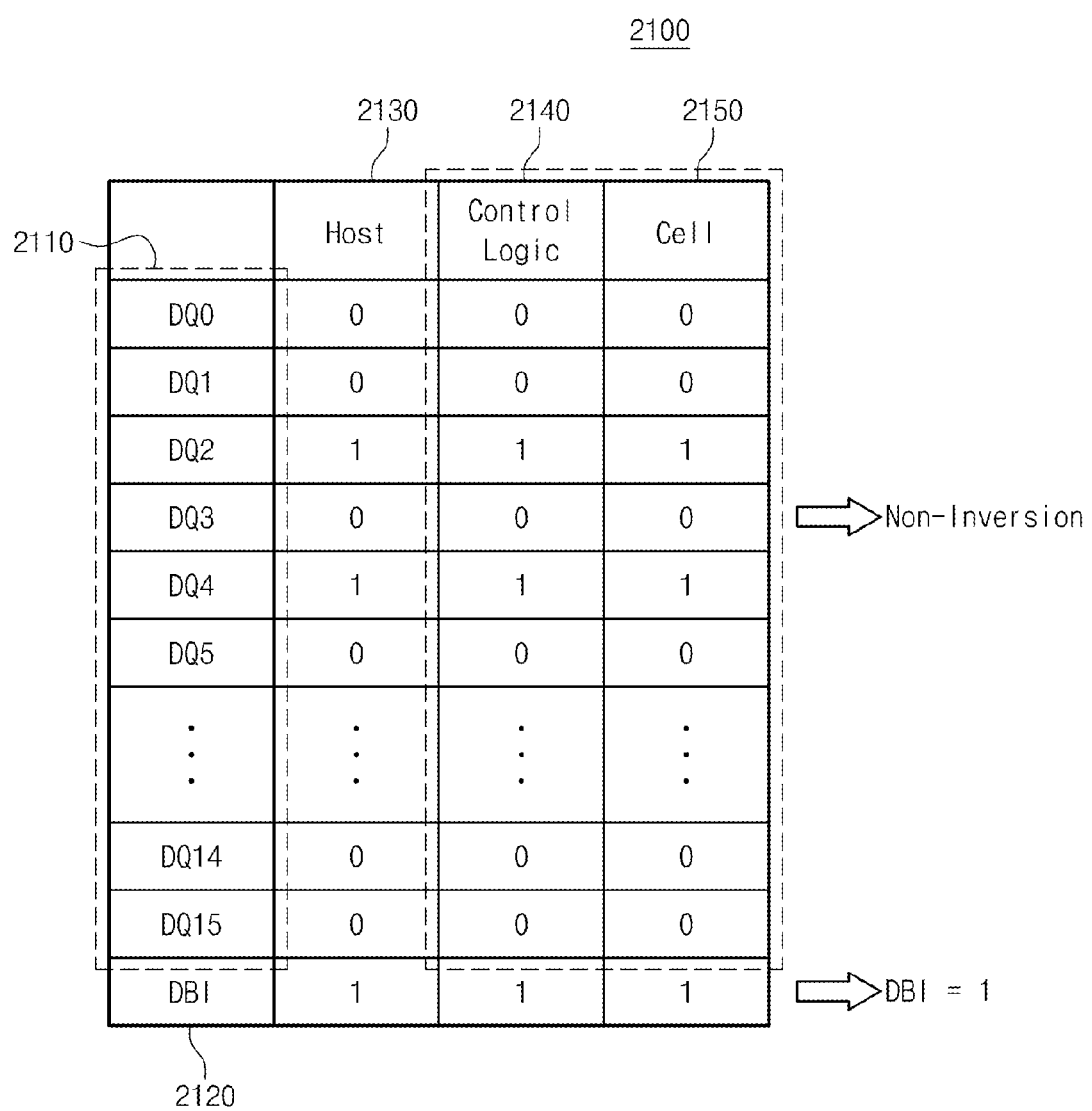
FIGS. 8 and 9 are diagrams illustrating a control method of a memory system according to an embodiment of the inventive concept.
Figure 9:
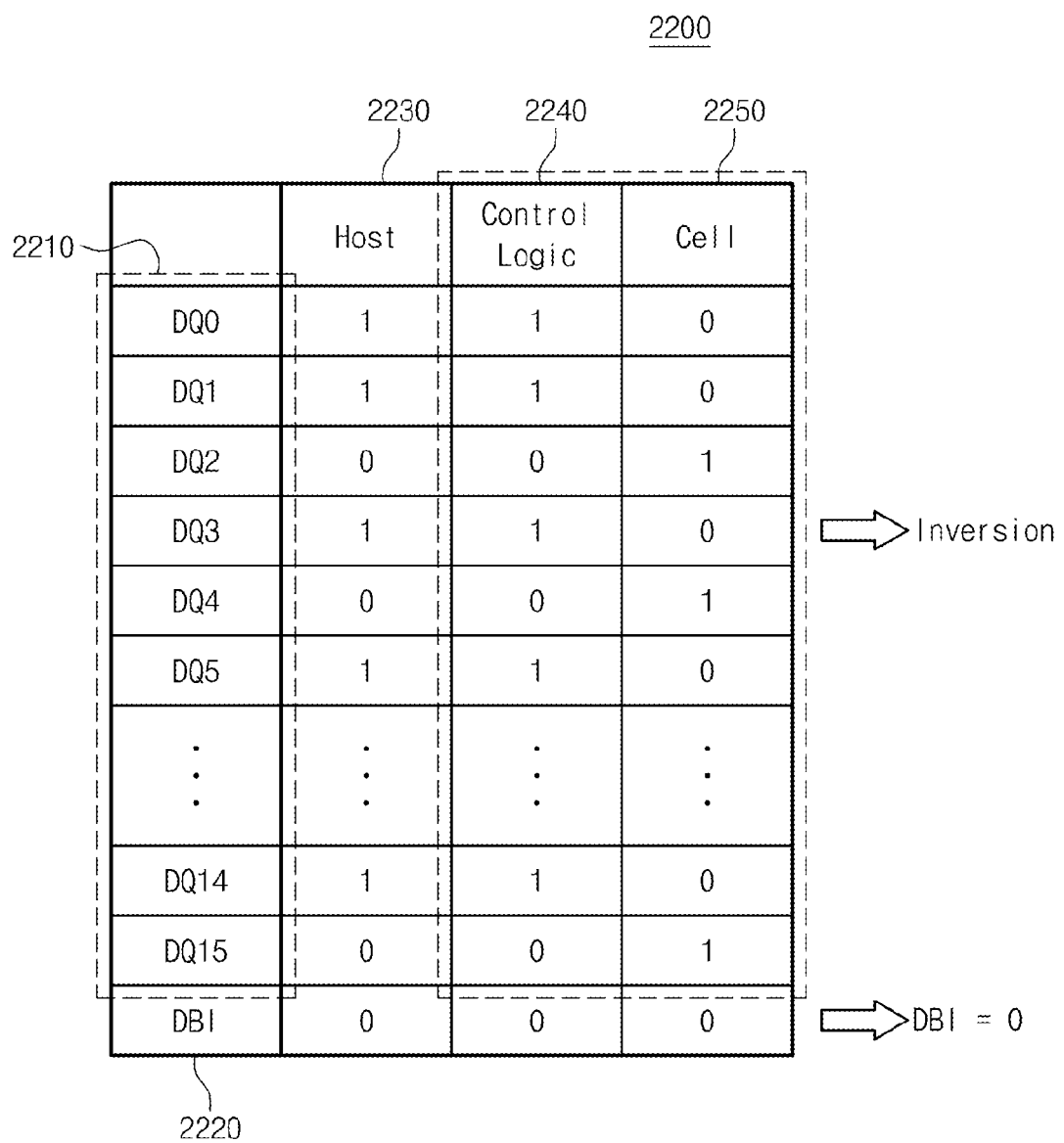

FIGS. 8 and 9 are diagrams illustrating a control method of a memory system according to an embodiment of the inventive concept. In FIGS. 8 and 9, there are illustrated state tables 2100 and 2200, respectively, which show a variation in data bits according to DBI information at a host 1100 (e.g., of FIG. 1), a nonvolatile memory device 1200 (e.g., of FIG. 1), and a memory cell array 1210 (e.g., of FIG. 2).

The state table 2100 may include a data field 2110, a DBI field 2120, a host field 2130, an NVM field 2140, and a memory cell field 2150. The state table 2200 may include a data field 2210, a DBI field 2220, a host field 2230, an NVM field 2240, and a memory cell field 2250. Each field may indicate a bit state of corresponding data. For example, the host fields 2130 and 2230 may indicate bit states at the host 1100 (e.g., of FIG. 1), the NVM fields 2140 and 2240 may indicate bit states received at the nonvolatile memory device 1200 (e.g., of FIG. 1), and the memory cell fields 2150 and 2250 may indicate bit states programmed at memory cells. The data fields 2110 and 2210 may indicate bit states of data, and the DBI fields 2120 and 2220 may indicate bit states of DBI information.

Referring to FIG. 8, the state table 2100 may show a bit variation when a major bit of data to be programmed is "0". The host field 2130 may include bit states of data and DBI information at the host 1100.

At a program operation, the host 1100 may count the number of "0" bits and/or "1" bits of data. Since a count result indicates that a "0" bit is a major bit, as can be seen in FIG. 8, DBI information may be set to "1" at the host 1100.

The NVM field 2140 may include bit states of data and DBI information, which the nonvolatile memory device 1200 receives. The bit states of data and DBI information, which the nonvolatile memory device 1200 receives, may be the same as bit states of data and DBI information at the host 1100.

As described above, the nonvolatile memory device 1200 may program bits of input data after inversion or without inversion according to the DBI information. In FIG. 8, since the DBI information is set to "1", the nonvolatile memory device 1200 may program bits of the input data without inversion. The DBI information may be programmed at a separate memory cell. Bit states of data programmed at memory cells may be illustrated at the memory cell field 2150.

At a read operation, the nonvolatile memory device 1200 may read data and DBI information stored at memory cells. Bits of the read data may be sent to the host 1100 after inversion or without inversion according to the DBI information.

In FIG. 8, since the DBI information has a value of "1", bits of the read data may be sent to the host 1100 without inversion. Thus, bit states of data and DBI information may be the same at the memory cell field 2150, the NVM field 2140, and the host field 2130.

Referring to FIG. 9, the state table 2200 may show a bit variation when a major bit of data to be programmed is "1". The host field 2230 may include bit states of data and DBI information at the host 1100.

At a program operation, the host 1100 may count the number of "0" bits or "1" bits of data. Since a count result indicates that a "1" bit is a major bit, as can be seen in FIG. 9, DBI information may be set to "0" at the host 1100.

The NVM field 2240 may include bit states of data and DBI information, which the nonvolatile memory device 1200 receives. The bit states of data and DBI information, which the nonvolatile memory device 1200 receives, may be the same as bit states of data and DBI information at the host 1100.

As described above, the nonvolatile memory device 1200 may program bits of input data after inversion or without inversion according to the DBI information. At a program operation, the host 1100 may count the number of "0" bits and/or "1" bits of data. Since a count result indicates that a "1" bit is a major bit, DBI information may be set to "0" at the host 1100.

In FIG. 9, since the DBI information is set to "0", the nonvolatile memory device 1200 may program inverted bits of the input data. The DBI information may be programmed at a separate memory cell. Bit states of data programmed at memory cells may be illustrated at the memory cell field 2250. Bit states of the memory cell field 2250 may have values that are opposite to bit states of the NVM field 2240.

At a read operation, the nonvolatile memory device 1200 may read data and DBI information stored at the memory cells. Bits of the read data may be sent to the host 1100 after inversion or without inversion according to the DBI information.

In FIG. 9, since the DBI information has a value of "0", bits of the read data may be sent to the host 1100 after inversion. Thus, bit states of the memory cell field 2250 may be opposite to bit states of the NVM field 2240 and the host field 2230.

Figure 10:
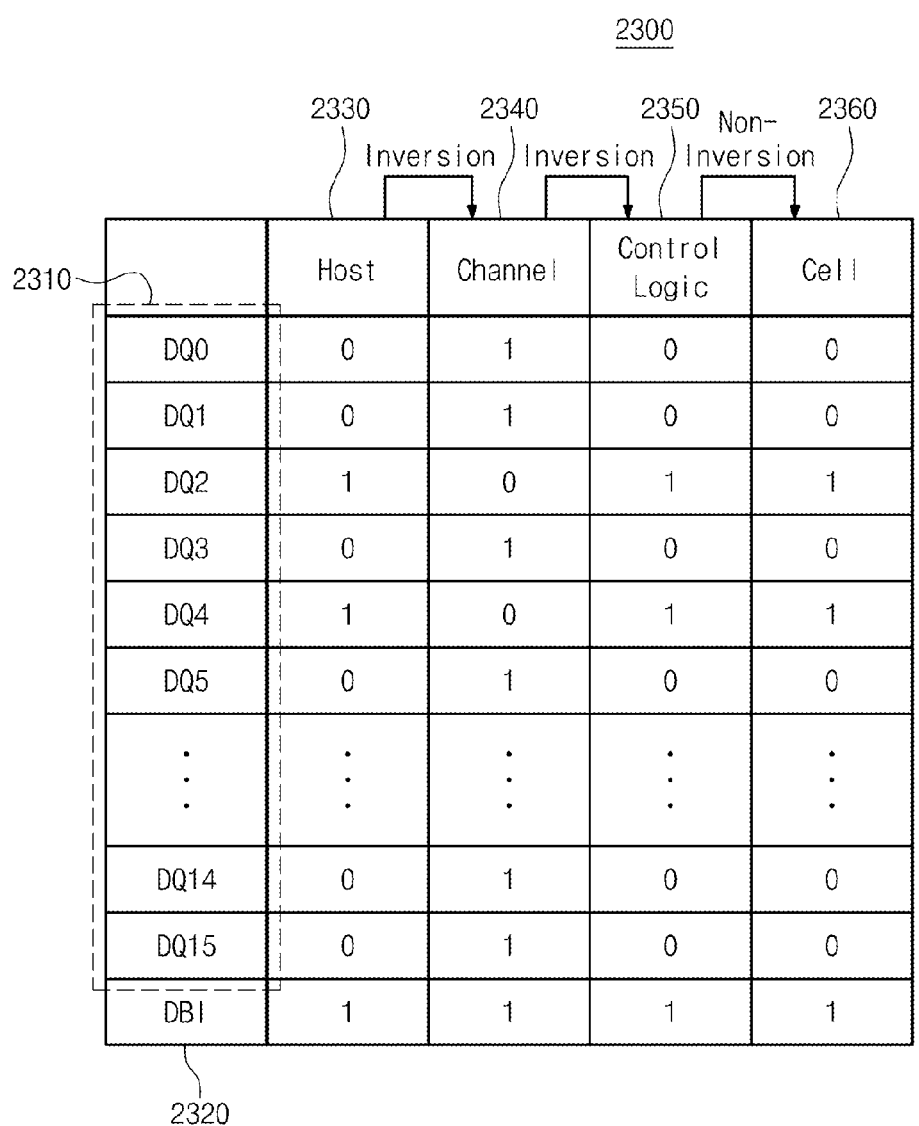
Figure 11:
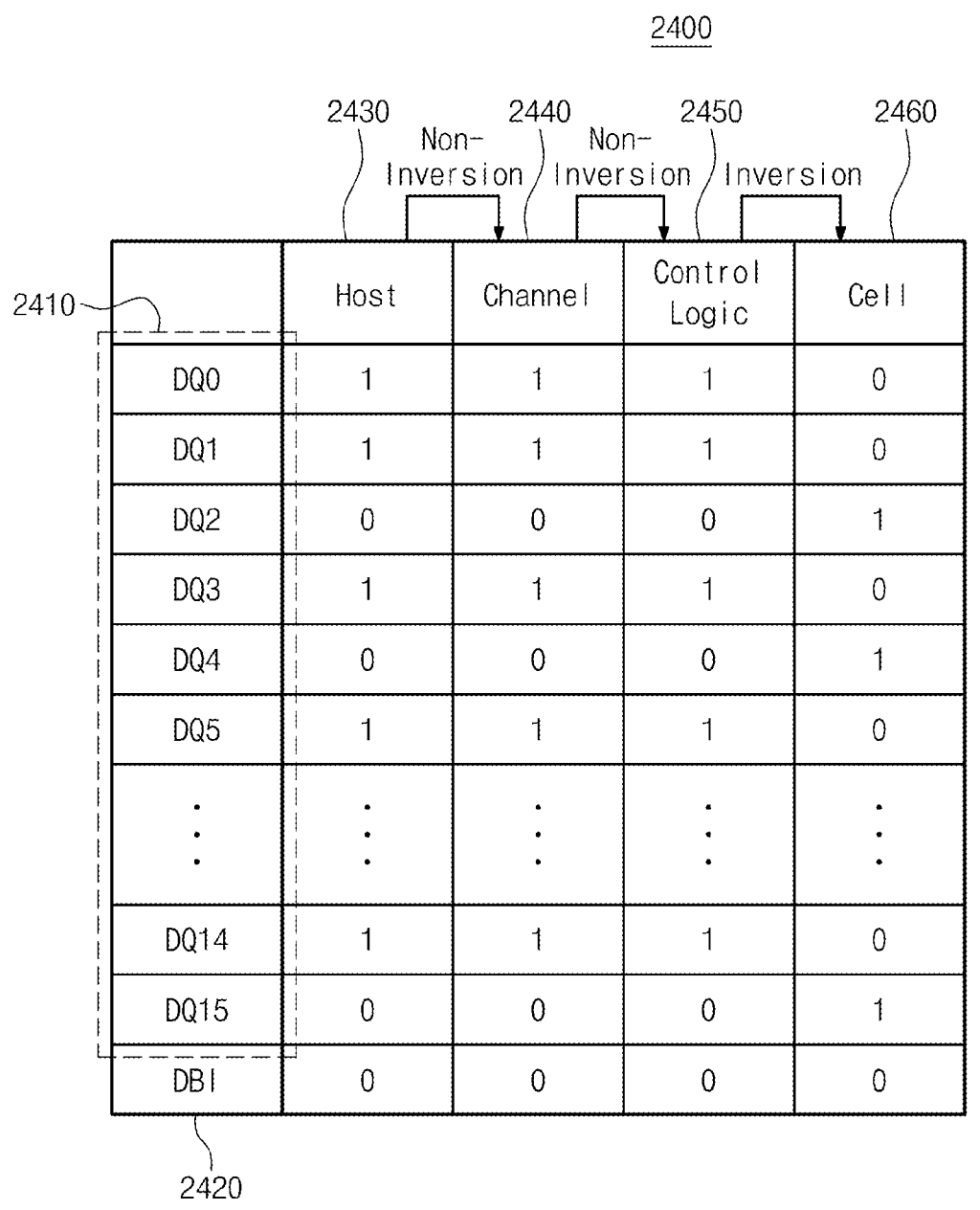

FIGS. 10 and 11 are diagrams schematically illustrating a control method of a memory system according to another embodiment of the inventive concept. In FIGS. 10 and 11, there are illustrated a variation in data and DBI information at a host 1100 (e.g., of FIG. 1), a data channel (e.g., of FIG. 1), a nonvolatile memory device 1200 (e.g., of FIG. 1), and a memory cell array 1210 (e.g., of FIG. 2).

In example embodiments, data bits may be inverted according to a major bit of the data bits before transmission to reduce signal interference and to reduce a current at the data channel. Signal interference and current can both increase at the data channel when a "0" bit is transferred, in comparison with a "1" bit.

The host 1100 may invert bits of data to be transferred according to a major bit of the data to be transferred, and may transfer the inverted bits to the nonvolatile memory device 1200. The nonvolatile memory device 1200 may invert bits of data transferred via the data channel according to the major bit.

Likewise, the nonvolatile memory device 1200 may invert bits of data to be transferred according to a major bit of the data to be transferred, and may transfer the inverted bits to the host 1100. The host 1100 may invert bits of data transferred via the data channel according to the major bit.

A state table 2300 may include a data field 2310, a DBI field 2320, a host field 2330, a channel field 2340, an NVM field 2350, and a memory cell field 2360, and a state table 2400 may include a data field 2410, a DBI field 2420, a host field 2430, a channel field 2440, an NVM field 2450, and a memory cell field 2460. For example, the host fields 2330 and 2430 may indicate bit states at the host 1100, the channel fields 2340 and 2440 may indicate bit states at the data channel, the NVM fields 2350 and 2450 may indicate bit states received at the nonvolatile memory device 1200, and the memory cell fields 2360 and 2460 may indicate bit states programmed at memory cells. The data fields 2310 and 2410 may indicate bit states of data, and the DBI fields 2320 and 2420 may indicate bit states of DBI information.

Referring to FIG. 10, the state table 2300 shows a bit variation when a major bit of data to be programmed is "0". The host field 2330 may include bit states of data and DBI information at the host 1100.

At a program operation, the host 1100 may count the number of "0" bits or "1" bits of data. Since a count result indicates that a "0" bit is a major bit, DBI information may be set to "1" at the host 1100.

The channel field 2340 shows bit states of data and DBI information to be transferred via the data channel. The host 1100 may invert bits of data to be transferred via the data channel based on the DBI information. As described above, signal interference and current both increase when a major bit of data is "0". Thus, since the DBI information has a value of "1", bits of data may be inverted at the host 1100, and the inverted bits may be transferred via the data channel.

The NVM field 2350 may include bit states of data and DBI information, which the nonvolatile memory device 1200 receives. The nonvolatile memory device 1200 may invert bits of data transferred via the data channel, based on the DBI information. Since the DBI information has a value of "1", as shown in FIG. 10, the nonvolatile memory device 1200 may invert bits of data transferred. Thus, a bit state of the NVM field 2350 may be the same as a bit state of the host field 2330, and opposite to a bit state of the data channel 2340.

As described above, the nonvolatile memory device 1200 may program bits of input data after inversion or without inversion according to the DBI information. In FIG. 10, since the DBI information is set to "1", the nonvolatile memory device 1200 may program bits of the input data without inversion. The DBI information may be programmed at a separate memory cell. Bit states of data programmed at memory cells may be illustrated at the memory cell field 2360.

At a read operation, the nonvolatile memory device 1200 may read data and DBI information stored at memory cells. Bits of the read data may be inverted according to the DBI information.

In FIG. 10, since the DBI information has a value of "1", bits of the read data may not be inverted. Thus, bit states of the memory cell field 2360 and the NVM field 2350 may be equal to each other.

While the read data is transferred via the data channel, the nonvolatile memory device 1200 can invert bits of data to be transferred according to the DBI information. Since the DBI information has a value of "1", bits of the read data may be inverted and transferred, so that the signal interference and current are reduced. In this case, bit states of the NVM field 2350 and the channel field 2340 may be opposite to each other.

The host field 2330 may show bit states of data and DBI information, which the host 1100 receives. The host 1100 may invert bits of data transferred via the data channel, based on the DBI information. Since the DBI information has a value of "1", bits of the received data may be inverted. Thus, a bit state of the host field 2330 may be the same as a bit state of the NVM field 2350, and opposite to a bit state of the data channel 2340.

Referring to FIG. 11, the state table 2400 shows a bit variation when a major bit of data to be programmed is "1". The host field 2430 may include bit states of data and DBI information at the host 1100.

At a program operation, the host 1100 may count the number of "0" bits or "1" bits of data. Since a count result indicates that a "1" bit is a major bit, as shown in FIG. 11, the DBI information may be set to "0" at the host 1100.

The channel field 2440 may show bit states of data and DBI information to be transferred via the data channel. The host 1100 may invert bits of data to be transferred via the data channel based on the DBI information. As mentioned above, signal interference and current increase when a major bit of data is "0". Thus, since the DBI information has a value of "0" (i.e., a major bit is "1"), bits of data may be transferred via the data channel without inversion, thereby reducing signal interference and current.

The NVM field 2450 may include bit states of data and DBI information, which the nonvolatile memory device 1200 receives. The nonvolatile memory device 1200 may invert bits of data transferred via the data channel, based on the DBI information. Since the DBI information has a value of "0", the nonvolatile memory device 1200 may receive bits of data transferred without inversion. Thus, bit states of the host field 2430, the channel field 2440, and the NVM field 2450 may be equal to one another.

As described above, the nonvolatile memory device 1200 may program bits of input data after inversion or without inversion according to the DBI information. In FIG. 11, since the DBI information is set to "0", the nonvolatile memory device 1200 may invert bits of the input data to program the inverted bits of data at memory cells. The DBI information may be programmed at a separate memory cell. Bit states of data programmed at memory cells are illustrated at the memory cell field 2460. A bit state of the memory cell field 2460 may be opposite to a bit state of the NVM field 2450.

At a read operation, the nonvolatile memory device 1200 may read data and DBI information stored at memory cells. Bits of the read data may be inverted according to the DBI information.

In FIG. 11, since the DBI information has a value of "0", bits of the read data may be inverted. Thus, bit states of the memory cell field 2460 and the NVM field 2450 may be opposite to each other.

While the read data is transferred via the data channel, the nonvolatile memory device 1200 can invert bits of data to be transferred according to DBI information. Herein, since the DBI information has a value of "0", bits of the read data may be transferred without inversion. In this case, bit states of the NVM field 2450 and the channel field 2440 may be equal to each other.

The host field 2430 may show bit states of data and DBI information, which the host 1100 receives. The host 1100 may invert bits of data transferred via the data channel, based on the DBI information. Since the DBI information has a value of "0", bits of the received data may not be inverted. Thus, a bit state of the host field 2430 may be the same as bit states of the NVM field 2450 and the channel field 2440.

Figure 12:
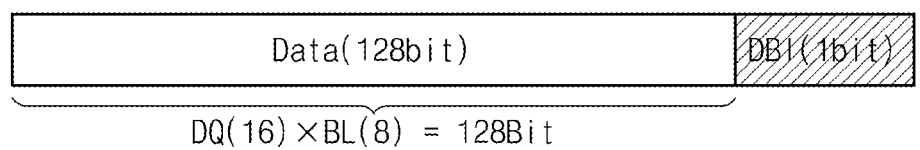
FIG. 12 is a diagram illustrating data bits and a DBI bit corresponding to the data bits.

FIG. 12 is a diagram illustrating data bits and a DBI bit corresponding to the data bits. In FIG. 12, there are illustrated data bits transferred by a data unit and a DBI bit corresponding to the data bits.

FIG. 12 illustrates an example in which data is transferred via 16 data lines DQ and 8 bus lines BL. In this case, 128-bit data may be transferred during one cycle. Also, 1-bit DBI information may be attached to the data transferred during one cycle. Like a parity bit of data, the DBI information may be placed at a front stage or a rear stage of the data. Thus, 1-bit DBI information may be transferred between a host 1100 (e.g., of FIG. 1) and a nonvolatile memory device 1200 (e.g., of FIG. 2) in connection with 128-bit data.

Figure 13:
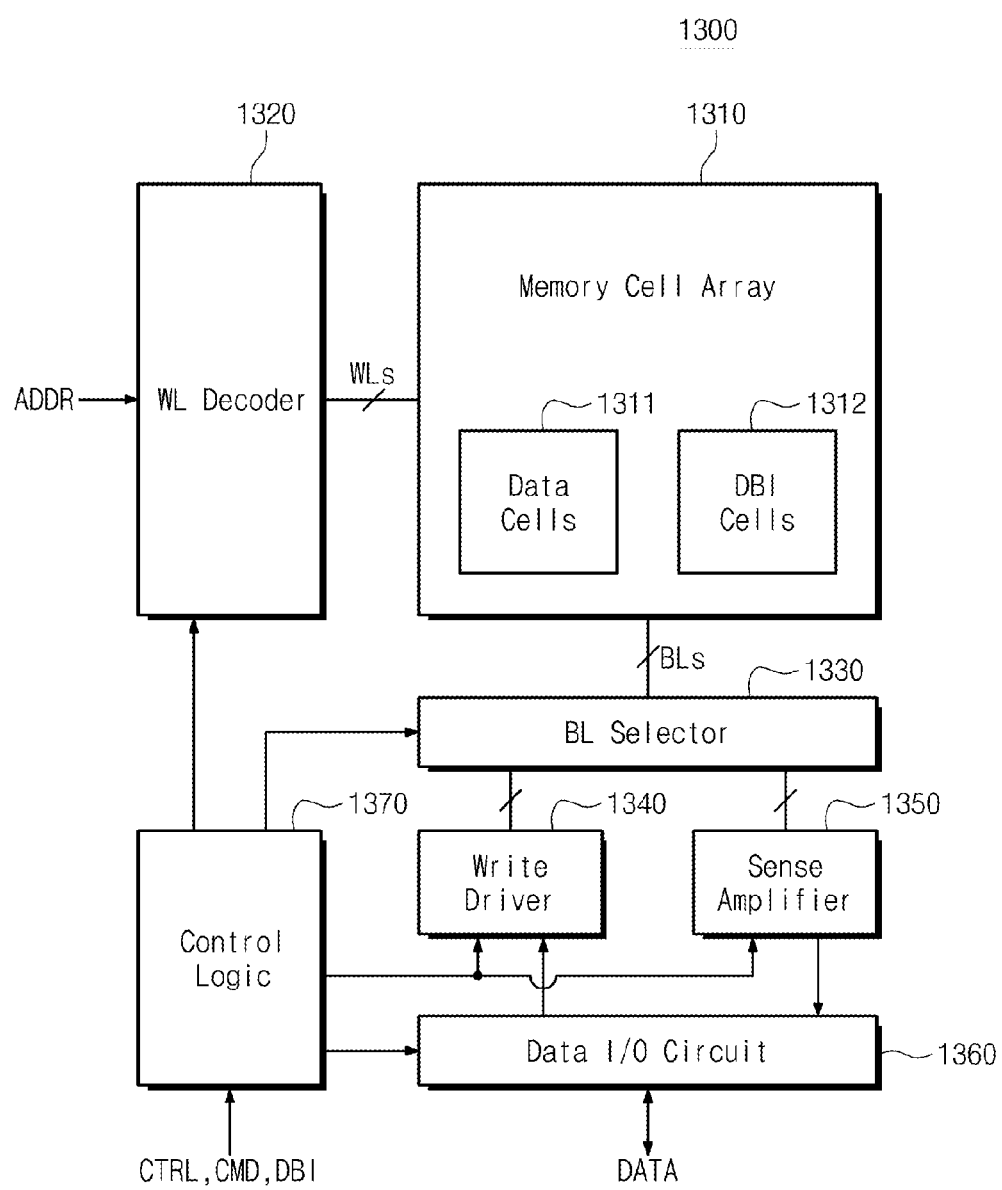
FIG. 13 is a block diagram schematically illustrating a nonvolatile memory device according to another embodiment of the inventive concept.

FIG. 13 is a block diagram schematically illustrating a nonvolatile memory device according to another embodiment of the inventive concept. Referring to FIG. 13, a nonvolatile memory device 1300 may include a memory cell array 1310, a word line decoder 1320, a bit line selector 1330, a write driver 1340, a sense amplifier 1350, a data input/output circuit 1360, and control logic 1370.

In example embodiments, the memory cell array 1310 may include data cells 1311 for storing data and DBI cells 1312 for storing DBI information. If data and corresponding DBI information are received, the nonvolatile memory device 1300 may store the data and the DBI information at separate memory spaces, respectively.

At a read operation, the nonvolatile memory device 1300 may read data from the data cells 1311 and DBI information corresponding to the read data from the DBI cell 1312.

The nonvolatile memory device 1300 may be substantially the same as a nonvolatile memory device in FIG. 2 except that the memory cell array 1310 includes the data cells 1311 and the DBI cells 1312 separated from each other.

Figure 14:
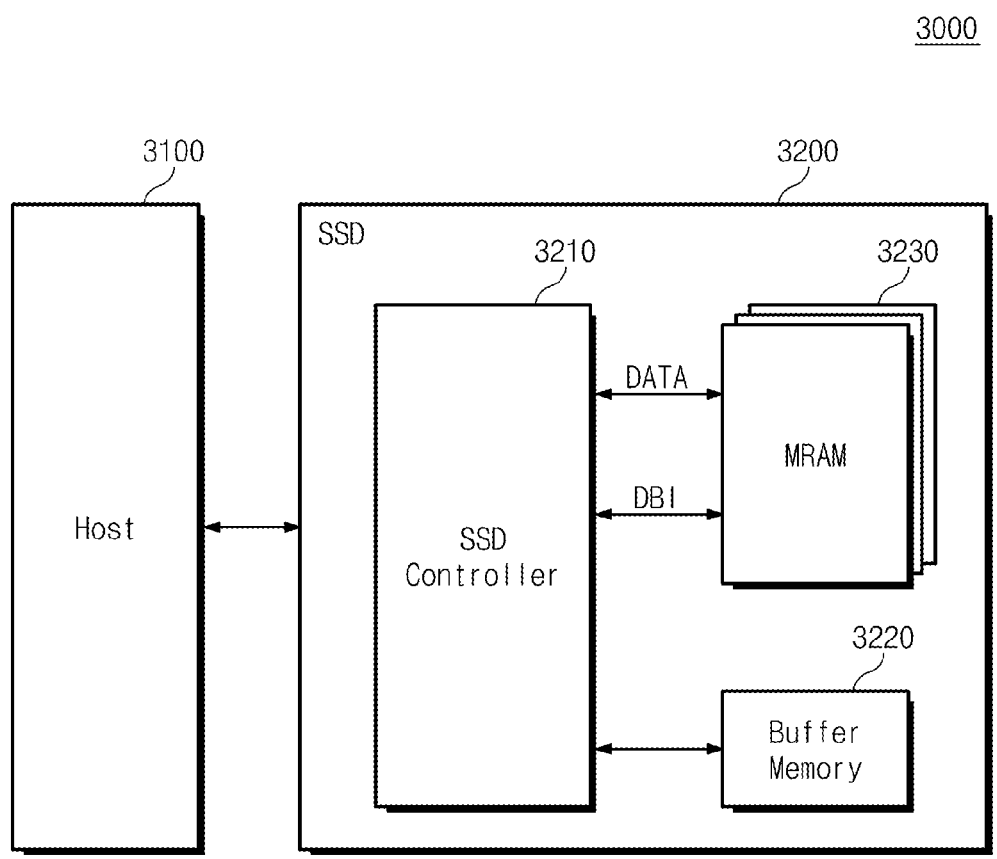
FIG. 14 is a block diagram illustrating a solid state drive according to an embodiment of the inventive concept.

FIG. 14 is a block diagram illustrating a solid state drive system 3000 according to an embodiment of the inventive concept. Referring to FIG. 14, a solid state drive (SSD) 3200 may include an SSD controller 3210, a buffer memory 3220, and a nonvolatile memory device 3230.

The SSD controller 3210 may provide physical interconnection between a host 3100 and the SSD 3200. The SSD controller 3210 may provide an interface with the SSD 3200 corresponding to a bus format of the host 3100. In particular, the SSD controller 3210 may decode a command provided from the host 3100 to access the nonvolatile memory device 3230 based on the decoding result. The bus format of the host 3100 may include USB (Universal Serial Bus), SCSI (Small Computer System Interface), PCI express, ATA, PATA (Parallel ATA), SATA (Serial ATA), SAS (Serial Attached SCSI), and so on.

The buffer memory 3220 may temporarily store write data provided from the host 1100 or data read out from the nonvolatile memory device 3230. In the event that data existing in the nonvolatile memory device 3230 is cached, at a read request of the host 3100, the buffer memory 3220 may support a cache function to provide cached data directly to the host 3100. Typically, a data transfer speed of a bus format (e.g., SATA or SAS) of the host 3100 may be higher than that of a memory channel of the SSD 3200. That is, in the event that an interface speed of the host 3100 is remarkably fast, lowering of the performance due to a speed difference may be minimized by providing the buffer memory 3220 having a large storage capacity.

The buffer memory 3220 may be formed of a synchronous DRAM to provide sufficient buffering to the SSD 3200 used as an auxiliary mass storage device. However, the buffer memory 3220 is not limited as such.

The nonvolatile memory device 3230 may be provided as a storage medium of the SSD 3200. For example, the nonvolatile memory device 3230 may be formed of a vertical NAND flash memory device having a mass storage capacity. The nonvolatile memory device 3230 may be formed of a plurality of memory devices. In this case, the memory devices may be connected to the SSD controller 3210 by a channel unit, respectively. As storage medium, the nonvolatile memory device 3230 may be formed of a NAND flash memory. However, the nonvolatile memory device 3230 is not limited to a NAND flash memory device. For example, a storage medium of the SSD 3200 can be formed of a PRAM, an MRAM, a ReRAM, a FRAM, a NOR flash memory, and the like. Further, the inventive concept may be applied to a memory system which uses different types of memory devices together. The nonvolatile memory device 3230 may be configured substantially the same as that described with reference to FIG. 2 or 13.

In the SSD 3200, the SSD controller 3210 may count bits of data to be programmed. The SSD controller 3210 may generate DBI information according to a major bit of the data to be programmed. For example, if a major bit of the data to be programmed is a "0" bit, the DBI information may be set to have a value of "1" by the SSD controller 3210. If a major bit of the data to be programmed is a "1" bit, the DBI information may be set to have a value of "0" by the SSD controller 3210. The SDD controller 3210 may transfer the DBI information to the nonvolatile memory device 3230 together with the data to be programmed.

The nonvolatile memory device 3230 may store data and DBI information received from the SSD controller 3210. At this time, the nonvolatile memory device 3230 may invert bits of the input data according to the DBI information before programming. This operation may be performed the same as described above.

With the above-described SSD 3200, it is possible to improve the reliability of stored data by reducing the RER.

Figure 15:
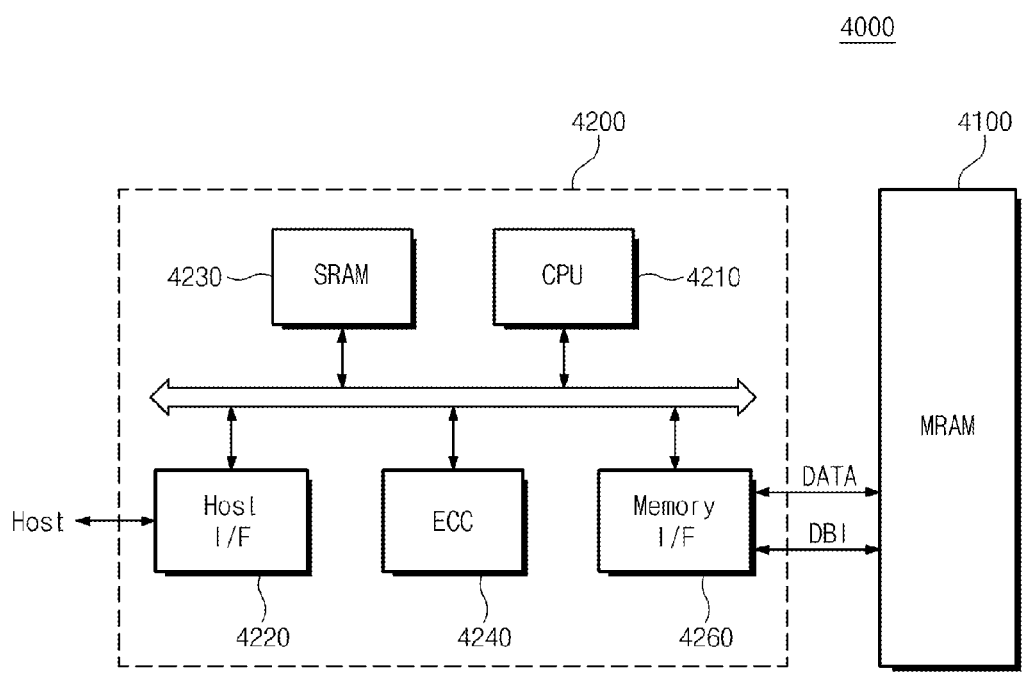
FIG. 15 is a block diagram schematically illustrating a data storage device according to an embodiment of the inventive concept.

FIG. 15 is a block diagram schematically illustrating a data storage device according to an embodiment of the inventive concept. Referring to FIG. 15, a data storage device 4000 according to the inventive concept may include a memory controller 4200 and a nonvolatile memory 4100.

The nonvolatile memory 4100 may be configured substantially the same as one of nonvolatile memory devices described with reference to FIGS. 2 and 13. In example embodiments, the nonvolatile memory 4100 may be an MRAM device including a plurality of MRAM cells.

The memory controller 4200 may be configured to control the nonvolatile memory 4100. An SRAM 4230 may be used as a working memory of a CPU 4210. A host interface 4220 may have a data exchange protocol of a host connected with the data storage device 4000. An ECC 4240 of the memory controller 4200 may detect and correct an error of data read from the nonvolatile memory 4100. A memory interface 4260 may interface with the nonvolatile memory 4100 of the inventive concept. The CPU 4210 may control an overall operation for data exchange of the memory controller 4200. Although not shown in FIG. 15, the data storage device 4000 may further include a ROM, which stores code data for an interface with the host.

The memory controller 4100 may be configured to communicate with an external device (e.g., a host) using one of various interface protocols such as USB, MMC, PCI-E, SAS, SATA, PATA, SCSI, ESDI, IDE, and so on.

In the data storage device 4000, the memory controller 4100 may count bits of data to be programmed. The memory controller 4100 may generate DBI information according to a major bit of the data to be programmed. For example, if a major bit of the data to be programmed is a "0" bit, the DBI information may be set to have a value of "1" by the memory controller 4100. If a major bit of the data to be programmed is a "1" bit, the DBI information may be set to have a value of "0" by the memory controller 4100. The memory controller 4100 may transfer the DBI information to the nonvolatile memory device 4100 together with the data to be programmed.

The nonvolatile memory device 4100 may store data and DBI information received from the memory controller 4100. At this time, the nonvolatile memory device 4100 may invert bits of the input data according to the DBI information before programming. This operation may be performed the same as described above.

With the above-described data storage device 4000, it is possible to improve the reliability of stored data by reducing the RER.

The data storage device 4000 may be applied to a computer, a portable computer, an UMPC (Ultra Mobile PC), a workstation, a net-book, a PDA, a web tablet, a wireless phone, a mobile phone, a smart phone, a digital camera, a digital audio recorder, a digital audio player, a digital picture recorder, a digital picture player, a digital video recorder, a digital video player, a device capable of transmitting and receiving information at a wireless environment, or one of user devices constituting a home network.

Figure 16:
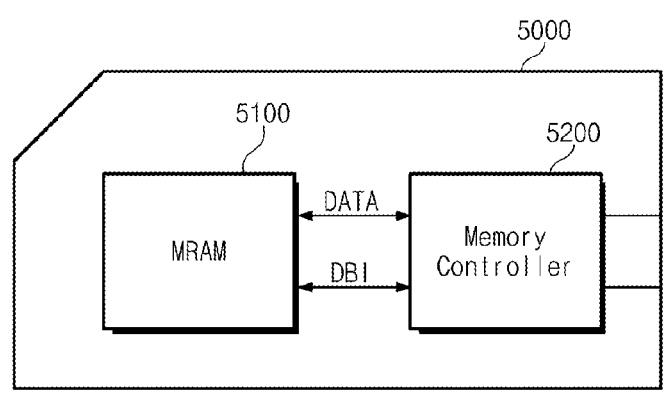
FIG. 16 is a block diagram schematically illustrating a memory card according to an embodiment of the inventive concept.

FIG. 16 is a block diagram schematically illustrating a memory card according to an embodiment of the inventive concept. Referring to FIG. 16, a memory card 5000 may include a magnetic random access memory (MRAM) 5100 and a memory controller 5200. The memory controller 5200 may control the MRAM 5100 based on control signals provided from an external device.

In the memory card 5000, the MRAM 5100 may be configured substantially the same as one of nonvolatile memory devices described with reference to FIGS. 2 and 13.

The memory controller 5200 may count bits of data to be programmed. The memory controller 5200 may generate DBI information according to a major bit of the data to be programmed. The memory controller 5200 may transfer the DBI information to the MRAM 5100 together with the data to be programmed.

The MRAM 5100 may store data and DBI information received from the memory controller 5200. At this time, the MRAM 5100 may invert bits of the input data according to the DBI information before programming. This operation may be performed the same as described above.

With the above-described memory card 5000, it is possible to improve the reliability of stored data by reducing the RER.

The memory card 5000 of the inventive concept may form a memory card device, an SSD device, a multimedia card device, an SD card, a memory stick device, a hard disk drive, a hybrid drive device, or a universal serial bus flash device. For example, the memory card 5000 may form a card satisfying the industrial standards for use of user devices such as a digital camera, a personal computer, and so on.

Figure 17:
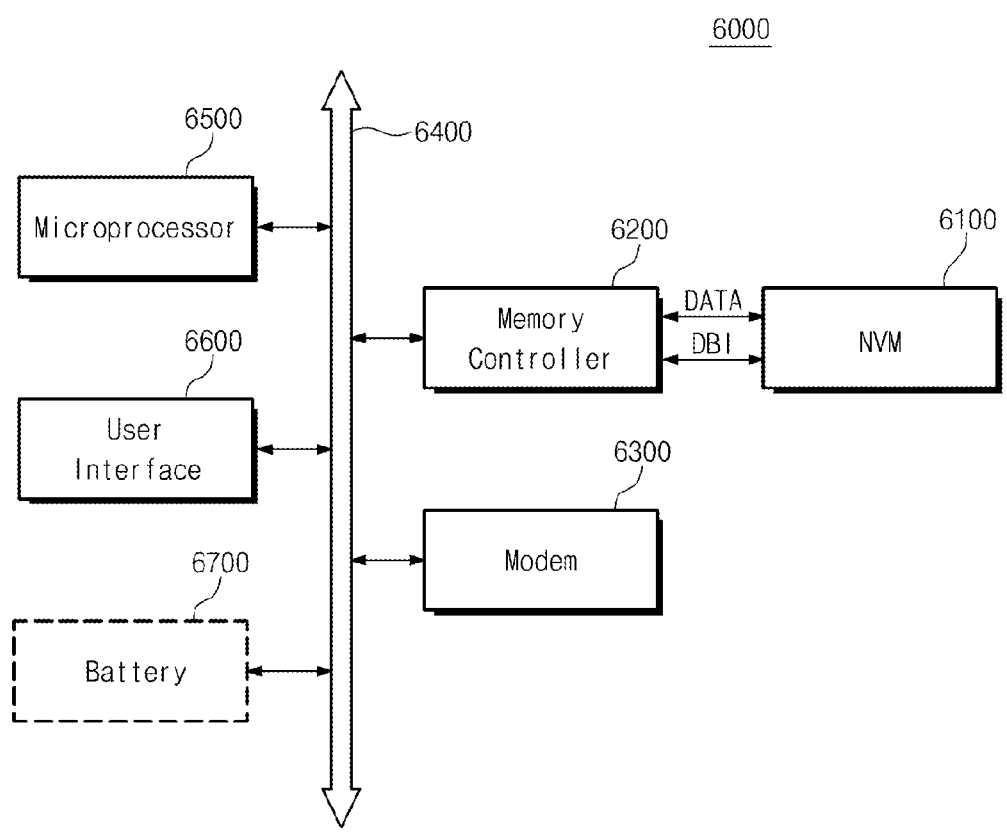
FIG. 17 is a block diagram illustrating a computing system including a memory system according to an embodiment of the inventive concept.

FIG. 17 is a block diagram illustrating a computing system including a memory system according to an embodiment of the inventive concept. Referring to FIG. 17, a computing system 6000 may include a nonvolatile memory device 6100, a memory controller 6200, a modem 6300 such as a baseband chipset, a microprocessor 6500, and a user interface 6600. The components 6200 to 6600 may be electrically connected to a bus 6400.

In the computing system 6000, the nonvolatile memory device 6100 may be configured substantially the same as one of nonvolatile memory devices described with reference to FIG. 2 or 13. The nonvolatile memory device 6100 may be a magnetic random access memory (MRAM) device.

The memory controller 6200 may count bits of data to be programmed. The memory controller 6200 may generate DBI information according to a major bit of the data to be programmed. The memory controller 6200 may transfer the DBI information to the nonvolatile memory device 6100 together with the data to be programmed.

The nonvolatile memory device 6100 may store data and DBI information received from the memory controller 6200. At this time, the nonvolatile memory device 6100 may invert bits of the input data according to the DBI information before programming. This operation may be performed the same as described above.

With the above-described computing system 6000, it is possible to improve the reliability of stored data by reducing the RER.

If the computing system 6000 is a mobile device, it may further include a battery 6700, which powers the computing system 6000. Although not shown in FIG. 17, the computing system 6000 may further include an application chipset, a camera image processor (CIS), a mobile DRAM, and the like. The nonvolatile memory device 6100 and the memory controller 6200 may constitute a solid state drive/disk (SSD), which uses a nonvolatile memory to store data, for example.

A nonvolatile memory device and/or a memory controller may be packed by one selected from various types of packages such as PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A memory system comprising:
   a host configured to:
      generate data bit inversion (DBI) information of data having an original state according to a major bit of the data;
      count the number of "0" bits relative to the number of "1" bits of the data having the original state;
      set the DBI information to a first value when a count result indicates that a "1" bit is the major bit;
      set the DBI information to a second value when the count result indicates that a "0" bit is the major bit; and
      invert, in a first inversion, one or more bits of the data having the original state in response to the DBI information having the second value;
   a data channel configured to transfer the one or more bits inverted in the first inversion; and
   a nonvolatile memory device configured to:
      receive the one or more bits inverted in the first inversion;
      invert, in a second inversion, the one or more bits of the data in response to the DBI information having the second value so that the one or more bits of the data are restored to the original state; and
      program the DBI information and the data having the original state.

2. The memory system of claim 1, wherein the nonvolatile memory device is configured to invert the one or more bits of the data according to the DBI information before programming of the data.

3. The memory system of claim 1, wherein the nonvolatile memory device is a magnetic random access memory.

4. The memory system of claim 1, wherein:
   the host is configured to not invert the one or more bits of the data having the original state in response to the DBI information having the first value;
   the data channel is configured to transfer the one or more bits having the original state; and
   the nonvolatile memory device is configured to:
      receive the one or more bits having the original state;
      invert, in a third inversion, the one or more bits of the data in response to the DBI information having the first value so that the one or more bits of the data have an inverted state; and
      program the DBI information and the data having the inverted state.

5. The memory system of claim 4, wherein the nonvolatile memory device comprises:
   a memory cell array including a plurality of memory cells connected with a plurality of bit lines and a plurality of word lines;
   a word line decoder configured to apply word line voltages to the word lines;
   a bit line selector configured to select at least one of the bit lines; and
   control logic configured to control the word line decoder and the bit line selector such that bits of the data inverted, in the third inversion, according to the DBI information are programmed at the plurality of memory cells.

6. The memory system of claim 5, wherein:
   the plurality of memory cells includes a plurality of data cells and a DBI cell associated with the plurality of data cells; and
   the control logic is configured to control the word line decoder and the bit line selector such that the inverted bits of the data are programmed at the plurality of data cells and the DBI information is programmed at the DBI cell.

7. The memory system of claim 6, wherein the nonvolatile memory device is configured to read bits programmed at the plurality of data cells in response to a read request from the host, and to invert the read bits according to the DBI information programmed at the DBI cell.

8. The memory system of claim 6, wherein:
   a first write voltage for programming a "0" bit at the plurality of data cells and a second write voltage for programming a "1" bit at the plurality of data cells have different polarities; and
   a read voltage for reading bits programmed at the plurality of memory cells is a voltage having the same polarity as one of the first and second write voltages.

9. The memory system of claim 1, wherein:
   the host is configured to transfer the data to the nonvolatile memory device from the host via the data channel; and
   the host is configured to transfer the DBI information to the nonvolatile memory device from the host via a DBI interface separated from the data channel.

10. The memory system of claim 1, wherein the first value is a logical "0" and the second value is a logical "1".

11. A control method of a memory system including a nonvolatile memory device, the method comprising:
    generating, by a host, data bit inversion (DBI) information according to the number of "1" bits of data relative to the number of "0" bits of the data having an original state, wherein generating includes:
  setting the DBI information to a first value when a count result indicates that a "1" bit is a major bit; and
  setting the DBI information to a second value when the count result indicates that a "0" bit is the major bit;
inverting, by the host, in a first inversion, one or more bits of the data having the original state in response to the DBI information having the second value;
transferring, by a data channel, the one or more bits inverted in the first inversion and the DBI information;
receiving, by the non-volatile memory device, the one or more bits inverted in the first inversion;
inverting, by the non-volatile memory device, in a second inversion, the one or more bits of the data in response to the DBI information having the second value so that the one or more bits of the data are restored to the original state; and
programming the one or more bits of the data having the original state at the nonvolatile memory device.

12. The control method of claim 11, further comprising:
not inverting, by the host, the one or more bits of the data having the original state in response to the DBI information having the first value;
transferring, by the data channel, the one or more bits having the original state;
receiving, by the nonvolatile memory device, the one or more bits having the original state;
inverting, by the nonvolatile memory device, in a third inversion, the one or more bits of the data in response to the DBI information having the first value so that the one or more bits of the data have an inverted state; and
programming, by the nonvolatile memory device, the DBI information and the data having the inverted state.

13. The control method of claim 12, wherein the nonvolatile memory device includes a plurality of data cells and a DBI cell associated with the plurality of data cells, the method further comprising:
programming the one or more bits of the data at the plurality of data cells; and
programming the DBI information at the DBI cell.

14. The control method of claim 13, further comprising:
reading bits programmed at the plurality of data cells in response to a request from the host; and
inverting the read bits according to the DBI information.

15. The control method of claim 11, wherein the nonvolatile memory device is a magnetic random access memory.

16. The control method of claim 11, wherein a first write voltage for programming a "0" bit at the nonvolatile memory device and a second write voltage for programming a "1" bit at the nonvolatile memory device have different polarities.

17. The control method of claim 16, wherein a read voltage for reading bits programmed at the nonvolatile memory device is a voltage having the same polarity as one of the first and second write voltages.

18. A method for programming data on a non-volatile memory device, the method comprising:
generating, by a host, data bit inversion (DBI) information according to the number of "1" bits of data relative to the number of "0" bits of the data having an original state, wherein generating includes:
  setting the DBI information to a first value when a count result indicates that a "1" bit is a major bit; and
  setting the DBI information to a second value when the count result indicates that a "0" bit is the major bit;
inverting, by the host, in a first inversion, one or more bits of the data having the original state in response to the DBI information having the second value;
not inverting, by the host, the one or more bits of the data having the original state in response to the DBI information having the first value;
transferring, by a data channel, the one or more bits of the data;
receiving, at the non-volatile memory device, the one or more bits of the data from the data channel;
receiving, at the non-volatile memory device, data bit inversion (DBI) information from the host;
inverting, by the non-volatile memory device, in a second inversion, the one or more bits of the data in response to the DBI information having the second value so that the one or more bits of the data are restored to the original state; and
inverting, by the non-volatile memory device, in a third inversion, the one or more bits of the data in response to the DBI information having the first value so that the one or more bits have an inverted state.

19. The method of claim 18, further comprising:
programming the one or more bits having the inverted state in the non-volatile memory device in response to the DBI information having the first value; and
programming the one or more bits having the original state in the non-volatile memory device in response to the DBI information having the second value.

20. The method of claim 18, further comprising:
reading the programmed one or more bits;
after reading the programmed one or more bits, inverting the one or more read bits in response to the DBI information having the first value; and
after reading the programmed one or more bits, not inverting the one or more read bits in response to the DBI information having the second value.

* * * * *